United States Patent [19]
Yamada et al.

[11] Patent Number: 6,166,406
[45] Date of Patent: Dec. 26, 2000

[54] PRECHARGE CIRCUIT AND SEMICONDUCTOR STORAGE DEVICE

[75] Inventors: Hitoshi Yamada; Sanpei Miyamoto, both of Tokyo, Japan

[73] Assignee: Oki Electric Industry Co., Ltd., Tokyo, Japan

[21] Appl. No.: 09/153,341

[22] Filed: Sep. 15, 1998

[30] Foreign Application Priority Data

Apr. 8, 1998 [JP] Japan ................. 10-112759

[51] Int. Cl.$^7$ ................. H01L 27/108
[52] U.S. Cl. ................. 257/296; 257/296; 257/297; 257/906; 257/908
[58] Field of Search ................. 257/296, 906, 257/908

[56] References Cited

U.S. PATENT DOCUMENTS

| | | | |
|---|---|---|---|
| 5,671,175 | 9/1997 | Lui et al. | 365/149 |
| 5,838,038 | 11/1998 | Takashima et al. | 257/301 |
| 5,932,906 | 8/1999 | Shimizu | 257/306 |
| 5,955,757 | 9/1999 | Jen et al. | 257/296 |
| 5,973,343 | 10/1999 | Takaishi | 257/296 |
| 6,005,268 | 12/1999 | Parekh et al. | 257/296 |
| 6,015,983 | 1/2000 | Parekh | 257/296 |
| 6,020,644 | 2/2000 | Tanigawa | 257/775 |
| 6,022,776 | 2/2000 | Lien et al. | 438/253 |

FOREIGN PATENT DOCUMENTS

| | | |
|---|---|---|
| 3-142875 | 6/1991 | Japan . |
| 405055504 | 3/1993 | Japan ................. 257/296 |
| 406005812 | 3/1993 | Japan ................. 257/296 |
| 405235298 | 9/1993 | Japan ................. 257/296 |
| 405251660 | 9/1993 | Japan ................. 257/296 |
| 8-167290 | 6/1996 | Japan . |
| 9-73779 | 3/1997 | Japan . |

*Primary Examiner*—Mahshid Saadat
*Assistant Examiner*—Edgardo Ortiz
*Attorney, Agent, or Firm*—Jones Volentine, LLC

[57] ABSTRACT

In the present invention, a precharge circuit includes a precharge supply for setting equal potentials at pairs of spaced signal lines extending in parallel with respect to each other, a pair of switching elements for connecting and disconnecting respective signal lines to the supply, and a short circuit switching element for connecting and disconnecting short circuiting of the signal lines. The short circuit switching element consists of a transistor comprising a source and drain constituted by a pair of impurity regions formed underneath the pair of signal lines so as to correspond to the pair of signal lines and a gate. The gate of the transistor is formed in such a manner that gate length coincides with the widthwise direction of the pair of signal lines.

19 Claims, 4 Drawing Sheets

Specific Example 1 of the Present Invention.

FIG. 1

Specific Example 1 of the Present Invention.

FIG. 2 Circuit Diagram of Memory Cell Array

FIG. 3

Specific Example 2 of the Present Invention

FIG. 4

Circuit Diagram for Specific Example 2

PRECHARGE CIRCUIT AND SEMICONDUCTOR STORAGE DEVICE

BACKGROUND OF THE INVENTION

1. Field of the Invention

The present invention relates to a precharge circuit and semiconductor storage device equipped with this precharge circuit suitable for precharging bit lines comprising a memory cell array.

2. Description of the Related Art

With Dynamic Random Access Memory (DRAM) equipped with a memory cell array where memory cells comprised of memory capacitors and select transistors are connected in a matrix shape by a multiplicity of bit lines and word lines, information is first read from the memory cells and the same prescribed potentials are applied to bit line pairs.

When the word line relating to the memory cell to be read from of the bit line pairs to which a potential has been applied is ascertained, a select transistor relating to this memory cell conducts. A load of a memory capacitor of the memory cell taken as the target is then discharged to one of the bit lines. A change in potential of one of the bit lines due to this discharged load is then sensed at a sense amplifier by making a comparison with the potential of the remaining bit line so that information of this memory cell is read.

In order to carry out the above precharge operation, a precharge circuit in which prescribed potentials are applied to bit line pairs comprises a precharge power supply for setting equal potentials at bit lines extending in parallel spaced on a semiconductor substrate, pairs of switching elements for putting the precharge power supply to bit line pairs on and off and short circuit switching elements for shorting bit lines in order to supply the same potential to selected bit line pairs.

The switching elements for this precharge circuit are comprised of MOS transistors having sources and drains constituted by pairs of impurity regions formed on a semiconductor substrate with gates formed between theses sources and gates.

With related MOS transistors constituting short circuit switching elements of the MOS transistors of precharge circuits, a pair of impurity regions for a source and drain corresponding to this bit line are formed at a certain bit line of a pair of bit lines and a gate having a gate length that is in the direction of extension of the bit lines and that lies between the bit lines is formed between the pair of impurity regions.

Increasing the gate width of the MOS transistors comprising the short circuit switching elements has been considered in order to increase the speed of precharging for setting prescribed equal potentials to the hit lines for short periods of time.

The gate length of gates of the short circuit switching elements are formed so as to extend along the direction of extension of the bit lines between bit line pairs. However, increasing the gate width in a direction at right angles to the gate length invites increases in the distances between certain bit lines of bit line pairs.

SUMMARY OF THE INVENTION

It is the object of the present invention to provide a precharge circuit and semiconductor storage device incorporating this precharge circuit where speed of a precharge operation can be increased without inviting increases in a distance between signal lines, i.e. with no loss of compactness.

In order to achieve the above object, a typical precharge circuit has a pair of switching elements for applying a precharge voltage to a pair of signal lines extending in a spaced manner on a semiconductor substrate, and a short circuit switching element for turning short circuiting of the signal lines on and off. The short circuit switching element comprises a transistor equipped with a source and drain constituted by a pair of impurity regions formed on said semiconductor substrate so as to correspond to said pair of signal lines, and a gate. The gate of this transistor is formed so that gate length coincides with a widthwise direction of the pair of signal lines.

The source and drain of the transistor constituting the short circuit switching element in the precharge circuit of the present invention are formed so as to correspond to the pair of signal lines. A channel is defined between the source and drain and a gate controlling connection and discontinuation of this channel that is between the signal lines has a gate length going in a widthwise direction of the signal lines.

The gate width of the gate electrode of this transistor is along the direction of extension of the signal lines. Gate width can therefore be increased without inviting increases in the distance between signal lines.

Increases in the gate width increase the channel cross section formed under the gates. Short circuit effects due to the conduction of the short circuit switching element therefore increase in line with increases in the channel cross section. The signal lines therefore rapidly reach a balanced state where the signal lines exhibit the same potential.

Therefore, according to the present invention, a high speed precharging operation can be achieved without inviting increases in the distance between the signal lines.

Further, a pair of switching elements for connecting and disconnecting a precharge supply and the signal lines comprise transistors having sources and drains constituted by a pair of impurity regions formed on a semiconductor substrate and gate electrodes.

The gate electrodes of die pair of switching elements extend widthwise across the direction of extension of the signal lines so as to leave a space with the ends of the signal lines. Further, one of the impurity regions of each of the pair of switching elements is formed on one side of each of the gate electrodes of the switching elements and the other impurity regions are formed on the other side of the gate electrodes of the switching elements so as to be formed along the pair of signal lines.

The impurity regions for the pair of switching elements that are formed on said one side can be formed in a continuous manner. The impurity regions of the pair of switching elements formed on said other side can be formed so as to be continuous with the pair of impurity regions corresponding to the short circuit switching element.

The gates for the pair of switching elements and the short circuit switching element are formed in a continuous manner.

When a multiplicity of groups of signal lines forming pairs are arranged, a pair of switching elements and short circuit switching are provided per each group. The gate electrodes of the switching elements extend continuously in a direction across the width of the signal lines.

When the multiplicity of groups of signal lines are arranged, an element separating switching element for electrically connecting and disconnecting impurity regions for the switching elements formed for the signal lines is provided between neighboring signal lines of neighboring groups.

The element separating switching element consists of a transistor having a commonly used source and drain of impurity regions for the short circuit switching element formed for neighboring signal lines of neighboring groups, and a gate formed between the impurity regions.

This element separating switching element is of a more compact configuration than element separation structures consisting of insulation material such as field insulation films for separating neighboring impurity regions of neighboring groups and reliably discontinues electrical connections between the impurity regions.

The gate electrode of the element separating switching element is formed so as to continue on from the gates of the pair of switching elements and the short circuit switching element.

The memory cell array is provided with a plurality of groups of pairs of bit lines, extending so as to be spaced from each other on a semiconductor substrate, to which precharge voltages are applied and switching elements for short circuiting bit lines when said precharge voltages are applied across said neighboring bit lines of said neighboring groups.

The switching elements are MOS transistors taking impurity regions connected to said bit lines correspondingly formed below said hit lines of said semiconductor substrate as sources and drains.

These MOS transistors have gales between the pair of impurity regions with gate length defined in the widthwise direction of the pairs of bit lines and extending in the direction of extension of the bit lines.

The present invention can be applied to a precharge circuit for bit lines of a memory cell array. By applying the present invention to a semiconductor storage device with this kind of discharge circuit, the precharge operation can be made to be high speed without inviting increases in the size of the storage device due to increases in the distance between the bit lines. A semiconductor storage device capable of high speed operation can therefore be provided.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The following is a detailed description with reference to the drawings of the embodiments of the present invention.

Figure 1:
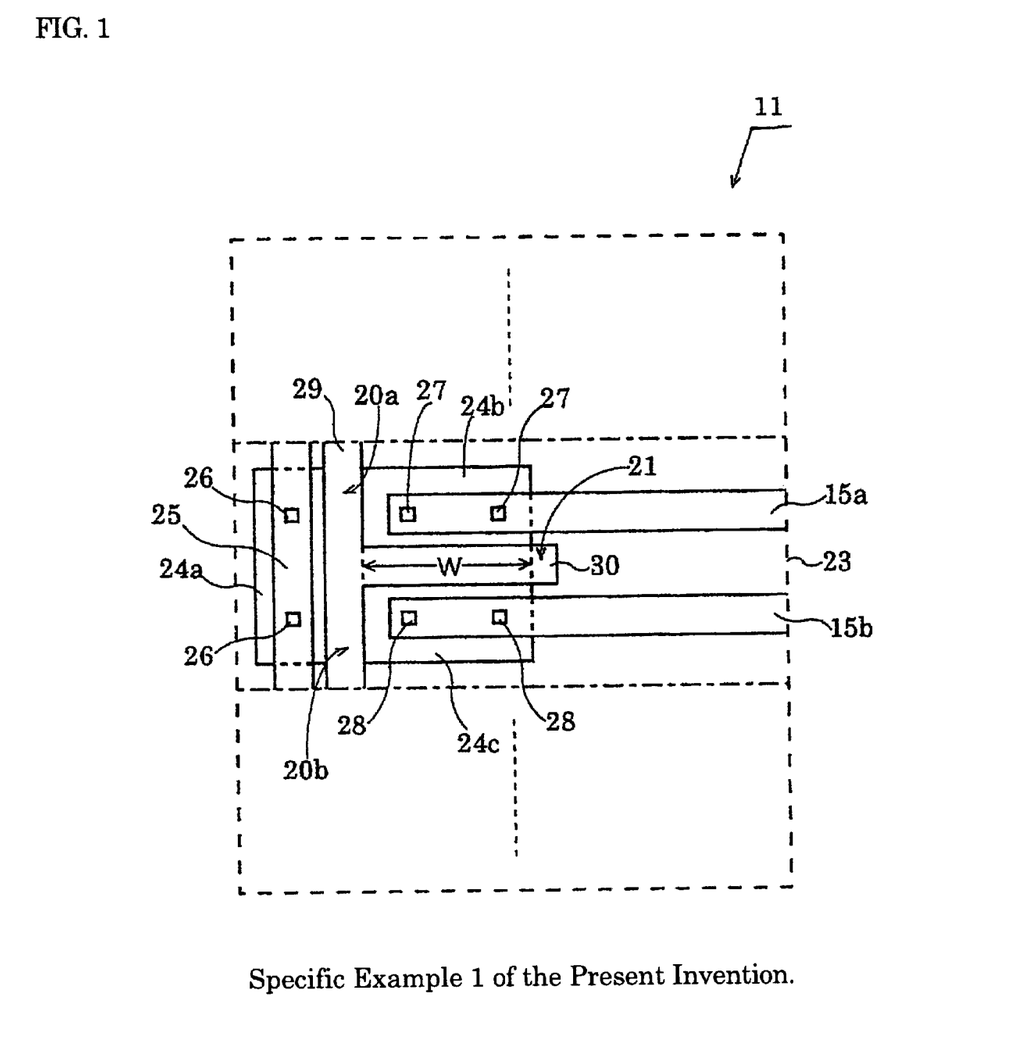
FIG. 1 is a plan view partially showing the layout of a first embodiment of a precharge circuit of the present invention.

FIG. 1 is a plan view of the layout of a first embodiment of a precharge circuit of a first embodiment of the present invention. First, in the description of this first embodiment, a semiconductor storage device of this first embodiment into which the precharge circuit relating to the present invention is incorporated is described in accordance with a memory array circuit diagram shown in FIG. 2.

Figure 2:
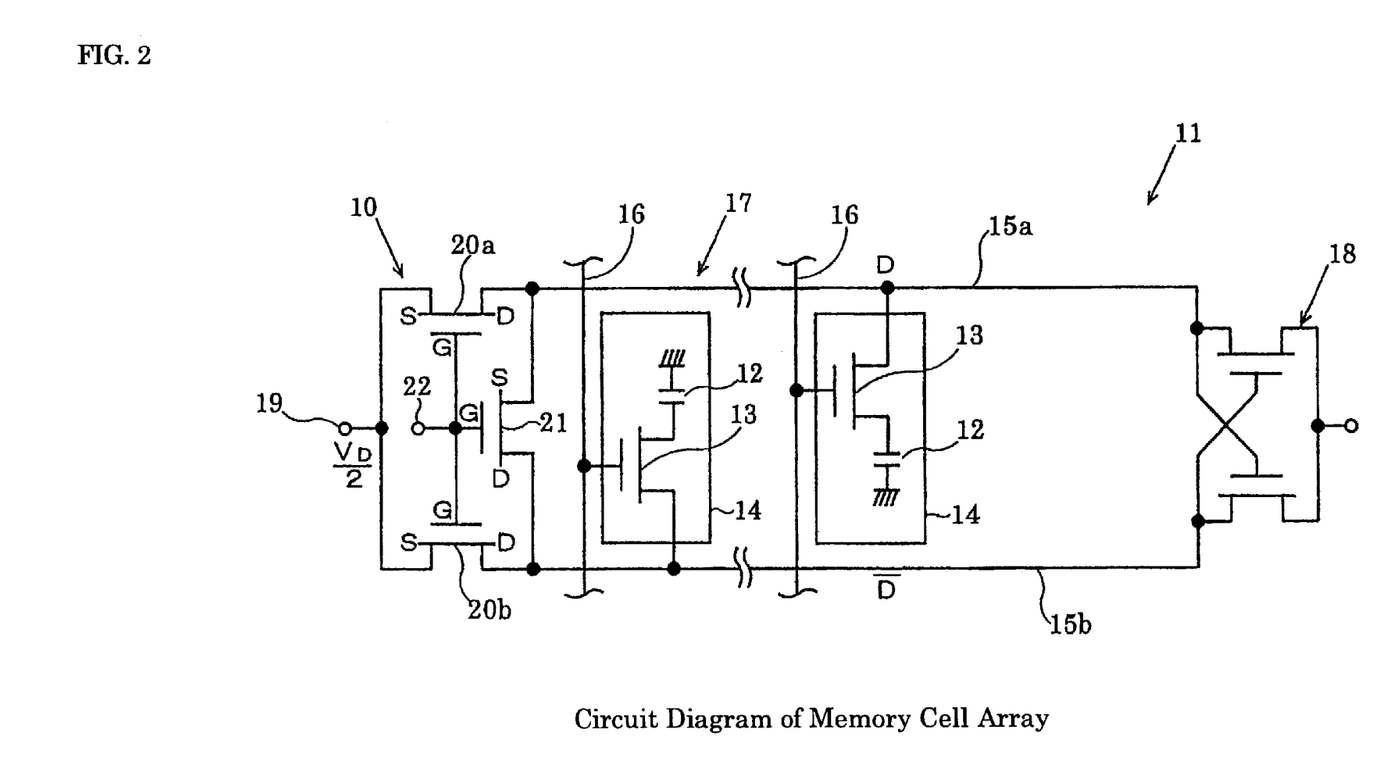
FIG. 2 is a circuit diagram showing part of a semiconductor storage device provided with the precharge circuit of the present invention.

As shown in FIG. 2 a semiconductor storage device 11 in which a precharge circuit 10 of the present invention is provided is constituted by a dynamic random access memory (DRAM) equipped with a memory cell array 17 where memory cells 14 comprised of memory capacitors 12 and select transistors 13 are connected together by a multiplicity of bit lines 15 (15a and 15b) and word lines 16 so as to form a matrix shape.

The multiplicity of bit lines 15 are constructed of bit line pairs (15a and 15b). A sense amplifier 18 is provided every group for sensing a potential difference of the bit lines 15a and 15b at the time of operations for reading information from the memory cells 14.

The precharge circuit 10 of the present invention is equipped with a precharge supply 19 for applying a prescribed equal potential to the bitline pair 15 (15a and 15b) selected beforehand in a read operation at the sense amplifier 18 and a pair of switching elements 20a and 20b (shown in the drawings collectively as "20") and short circuit switching element 21 provided every group 15 of bit line pairs (15a and 15b).

The pair of switching elements 20a and 20b comprises first and second MOS transistors 20a and 20b with sources S and drains D connected to corresponding bit lines 15 (15a and 15b) and the precharge supply 19, respectively. Connection of the precharge supply 19 and the hit lines 15 (15a and 15b) can then be made or broken by voltage control to the gates G of the transistors 20.

The shortcircuit switching element 21 consists of a third MOS transistor 21. The source S and drain D of this MOS transistor 21 are connected to the corresponding bit lines 15a and 15b, respectively. Short circuiting of the bit lines 15a and 15b is then carried out by controlling the gate voltage to the gate of the MOS transistor 21.

In the example shown in the drawings, a gate voltage for controlling connection and breaking of conduction between the sources S and drains D of the MOS transistors 20 and 21 is applied to gates G via a common gale electrode 22.

An intermediate value (VD/2) for a binary voltage value (high level value and low level value) constituting a write voltage to the memory capacitor 12 is used as the precharge supply 19 and the so-called VD/2 precharge method is adopted.

Prior to reading information from a selected memory cell 14, a gate potential is applied to the common gate terminal 22 of one group of bit lines 15 (15a and 15b) including the bit lines 15a and 15b of this selected memory cell 14.

The first and second MOS transistors 20a and 20b constituting switching elements for the bit line pair 15a and 15b for the selected group (15) and the third MOS transistor 21 are made to conduct by the application of this gate potential. A prescribed voltage value (VD/2) is then applied to the bit lines 15a and 15b due to the conduction of the pair of MOS transistors 20a and 20b. The potentials of the bit lines 15a and 15b therefore soon become balanced at the same potential because the bit lines 15a and 15b become short circuited due to simultaneous conduction at the third MOS transistor 21 constituting the short circuit switching element.

In the read operation after the aforementioned precharge operation, when the word line relating to the memory cell 14 to be read of the pair of bit lines 15a and 15b to which the same potential is applied is ascertained, the select transistor 13 for this memory cell 14 conducts. The load of the memory capacitor 12 of the memory cell 14 taken as a target is then discharged at one of the bit lines 15a or 15b via the select transistor due to the conduction of this select transistor 13. A change in voltage of one of the bit lines 15a or 15b due to this discharged load is then sensed by the sense amplifier 18 by making a comparison with the voltage of the remaining bit line 15b or 15a so that information of the memory cell 14 taken as the read target is read.

The gate width of the MOS transistor 21 constituting the short circuit switching element 21 in the precharge circuit 10 of the present invention is increased in order to increase the speed of the precharge operation.

FIG. 1 shows a plan layout of the precharge circuit 10 shown in FIG. 2.

As shown in FIG. 1, at the semiconductor storage device 11, a multiplicity of bit lines 15 (15a and 15b) forming pairs are formed on the substrate 23. In FIG. 1, just one group of a pair of bit lines 15a and 15b are shown for simplicity, and a plurality of other groups of parallel bit lines 15 are omitted.

First and second MOS transistors 20a and 20b constituting a pair of switching elements aid a third MOS transistor 21 constituting the short circuit switching element are incorporated into a semiconductor substrate 23. The memory cells 14, word lines 16 and sense amplifier 18 etc. are also incorporated into the semiconductor substrate 23, although this is not shown in FIG. 1.

The bit line pair 15a and 15b extend in parallel so as to be spaced from each other.

Impurity regions 24a, 24b and 24c for the MOS transistors 20a, 20b and 21 are formed in the vicinity of the ends of the bit lines 15a and 15b of the semiconductor substrate 23.

The first impurity region 24a is formed so is to extend in the direction of the width of the bit lines at a distance from the ends of the bit lines 15a and 15b. A power supply line 25 extending in the direction of the width of the bit lines at right angles to the direction of extension of the bit lines 15a and 15b is formed at the upper surface of the first impurity region 24a. The power supply line 25 is connected to the precharge supply 19 and the first impurity region 24a is connected to the power supply line 25, i.e. the precharge supply 19 via a contact 26.

The second impurity region 24b extends in the lengthwise direction of the bit lines, so as to correspond to the bit lines, at the lower part of the end part of one of the bit lines 15a. The third impurity region 24c extends in the direction of extension of the bit lines, so as to correspond to the bit lines, at the lower part of the end of the remaining bit line 15c.

The second and third impurity regions 24b and 24c extend at right angles to the first impurity region 24a in such a manner as to be parallel with respect to each other and in such a manner that ends positioned at the side of the first impurity region 24a are spaced from the first impurity region 24a. The second impurity region 24b and the third impurity region 24c are connected to corresponding bit lines 15a and 15b via respective pluralities of contacts 27 and 28.

An electrode for a gate, i.e. a gate electrode 29 is formed between the first impurity region 24a and the ends of the second impurity region 24b and third impurity region 24c. The gate electrode 29 extends in a direction going across the bit lines 15 (15a and 15b), i.e. extends at a distance from the power supply line 25 in parallel with the power supply line 25 in the widthwise direction of the bit lines.

This gate electrode 29, together with half of the first impurity region 24a formed on said one side taken as a source S and the second impurity region 24b formed at said other side of the gate electrode 29 taken as a drain D, comprises the first MOS transistor 20a constituting one of the switching elements of the pair of switching elements 20.

The gate electrode 29, together with the remaining half of the first impurity region 24a formed on said one side of the gate electrode 29 taken as a source S and the third impurity region 24c formed on said other side of the gate electrode 29 taken as a drain D, comprises the second MOS transistor 20b.

An electrode for a gate extending parallel with the bit lines 15, i.e. a gate electrode 30, is formed between the second impurity region 24b and the third impurity region 24c. This gate electrode 30, together with the second impurity region 24b formed on this side and the third impurity region 24c formed on the other side, comprises the third MOS transistor 21 taking the second impurity region 24b and the third impurity region 24c as a source S and drain D, respectively.

In the example in the drawings, the gate electrode 29 for the first and second MOS transistors 20a and 20b and the gate electrode 30 for the third MOS transistor 21 are formed continuously. These gate electrodes 29 and 30 function as the common gate terminal 22.

When a gate potential is applied to the gate terminal 29 and the gate terminal 30, the first, second and third MOS transistor 20a, 20b and 21 simultaneously start to conduct.

The power supply line 25 is connected to the bit lines 15 (15a and 15b) due to the conduction of the first and second MOS transistors 20a and 20b. A prescribed voltage value (VD/2) is therefore applied to the bit lines 15a and 15b.

The bit lines 15a and 15b become short circuited due to the conduction of the third MOS transistor 21 operating simultaneously with the MOS transistors 20a and 20b. The third MOS transistor 21 functioning as this short circuit switching element has a source and drain formed on either side of the gate electrode 30 extending parallel with the bit lines between the bit lines 15a and 15b.

A direction at right angles to the direction of extension of the gate electrode 30, i.e. a widthwise direction of the bit lines that crosses the bit lines 15 is the gate length and a gate width of the gate electrode 30 therefore coincides with the direction of extension of the bit lines 15.

The second impurity region 24b and the third impurity region 24c therefore extend in the direction of extension of the bit lines under the bit lines 15. The gate electrode 30 between the bit lines 15a and 15b then corresponds to the impurity regions 24b and 24c and extends along the bit lines 15. As a result, increases in the gate width W of the third MOS transistor 21 constituting the short circuit switching element 21 can be achieved without inviting increases in the distance between the bit lines 15a and 15b.

Potentials of the bit lines 15a and 15b during operation of the precharge circuit 10 therefore become balanced more rapidly than was conventionally the case. The precharge operation can therefore be made more rapid without inviting increases in the dimensions in the widthwise direction of the bit lines 15 of the semiconductor storage device 11 and it is therefore possible to make read operations of the semiconductor storage device 11 faster due to the rapidness of the precharge operation.

Figure 3:
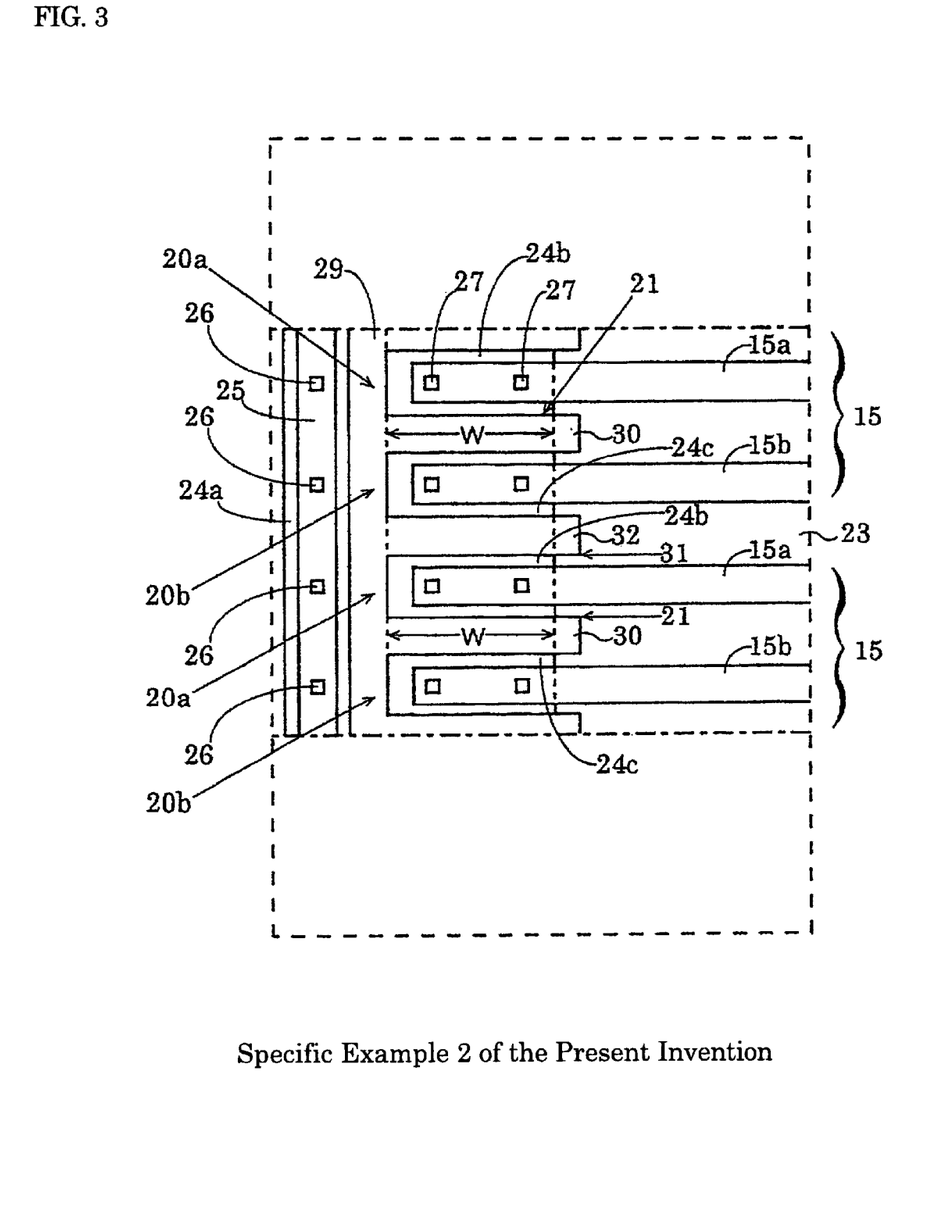
FIG. 3 is a plan view partially showing the layout of a second embodiment of a precharge circuit of the present invention.

In a second embodiment of the present invention, as shown in FIG. 3, a fourth MOS transistor 31 constituting an element separating switching element is formed between each group of bit lines 15a and 15b.

The second impurity region 24b and third impurity region 24c are formed below each group of bit lines 15 (15a and 15b). The second impurity regions 24b and third impurity regions 24c formed below the bit lines 15a and 15b every group function as the sources and drains of the third MOS transistors 21. Short circuits across the sources and drains of these MOS transistors therefore do not become a problem.

However, insulation between the third impurity region 24c formed under neighboring bit lines 15b and 15a every group and the second impurity region 24b becomes a greater problem a the degree of integration is raised when a third MOS transistor 21 is not constructed.

The second impurity region 24b and the third impurity region 24c formed under neighboring bit lines 15a and 15b between each group have to be reliably electrically isolated during non-precharge operations.

Adopting, for example, a field insulation film has been considered as an element separating structure for between the problematic impurity regions 24b and 24c in order to ensure this insulation.

However, as shown in FIG. 3, insulation can be increased in a more compact and reliable manner than compared with element separating structures such as field insulating films by constructing a fourth MOS transistor 31 for the impurity regions 24b and 24c for which insulation is problematic.

The fourth MOS transistor 31 constituting an element separating switching element has a gate electrode 32 spaced from neighboring bit lines 15a and 15b of neighboring groups 15 and extending in a direction or extension of the bit lines therebetween.

In the example shown in the drawings, the gate electrode 32 is formed as a single body continuing on from the gate electrode 29 for the first and second MOS transistors 20a and 20b in the same way as the gate electrode 30 for the third MOS transistor 21.

With the fourth MOS transistor 31, the third impurity region 24c formed below one of the bit lines 15b of the group of bit lines 15 positioned on the side of the gate electrode 32 and the second impurity region 24b formed below the remaining bit line 15a of the other group 15 positioned on the other side of the gate electrode 32 are taken as the source and drain, respectively.

Therefore, at the fourth MOS transistor 31, a gale electrode 32 with a gate length defined in the widthwise direction of the bit lines 15a and 15b extends in the lengthwise direction of the bit lines 15a and 15b.

A fourth transistor 31 formed with a common source and drain by the impurity regions 24b and 24c for forming this source and drain is formed using photolithographic and etching technologies in the same way as for the MOS transistors 20a, 20b and 21. More detailed processing than that of forming field oxidation films can therefore be easily achieved. At the MOS transistor 31, the impurity regions 24b and 24c of both sides of the gate electrode 32 constituting the source and drain at times of non-conduction can be electrically isolated in a reliable manner.

Incorporating the fourth MOS transistor 31 into a semiconductor 11 requiring a high degree of integration is particularly effective.

Figure 4:
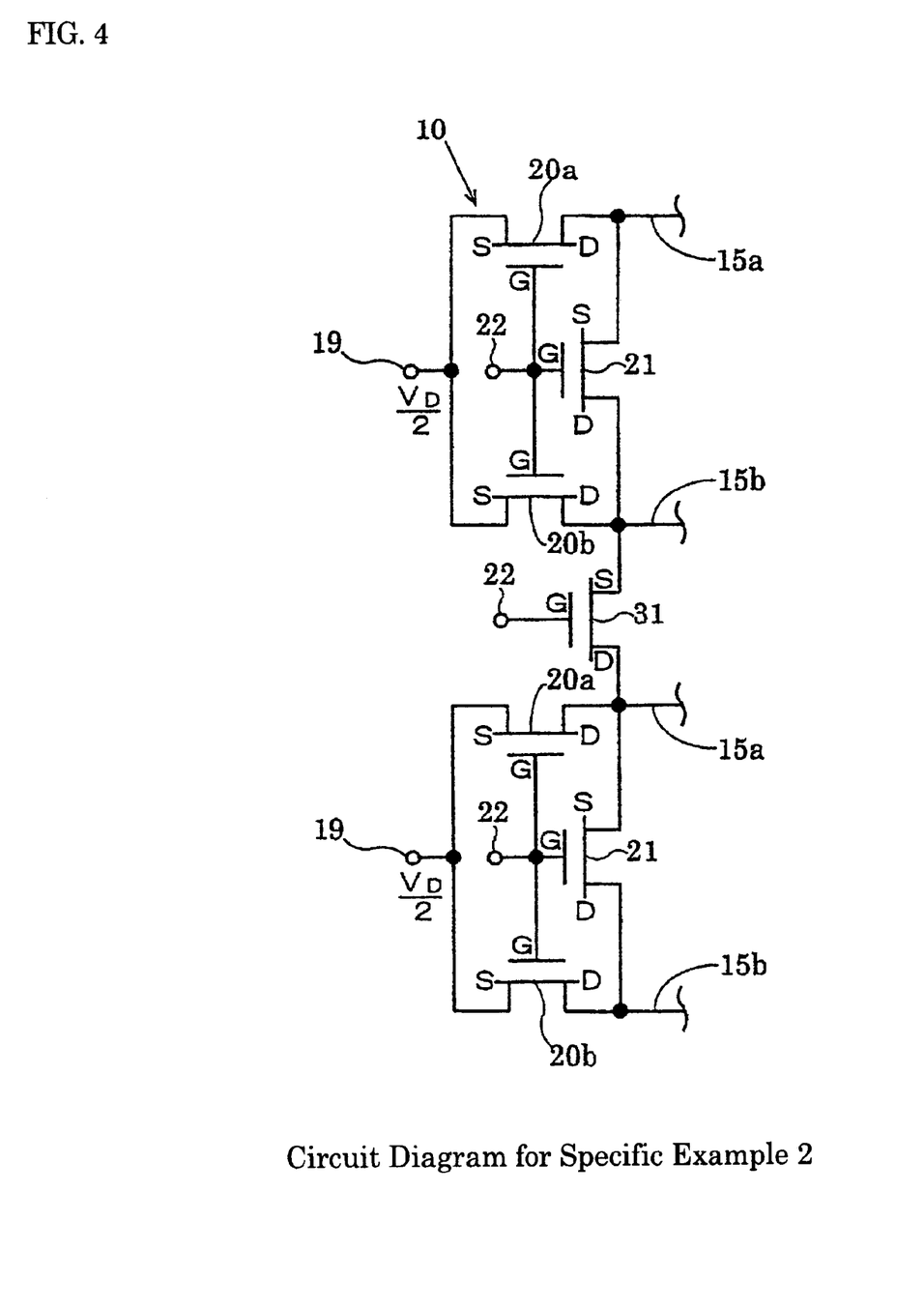
FIG. 4 is a partial circuit diagram of the second embodiment.

FIG. 4 shows a circuit diagram of the second embodiment.

When a precharge voltage (VD/2) is applied to the bit lines 15 (15a and 15b), the fourth MOS transistor 31 short circuits one group bit line 15b of a neighboring group and the other group bit line 15a of the neighboring group.

In the above, a description is given of the present invention applied to a precharge circuit for bit lines of a semiconductor device. The present invention is, however, by no means limited in this respect and can also be applied to precharge circuits for other signal lines such as active signal lines of a sense amplifier or data lines.

Further, the arrangement of the layout of the precharge circuit of the present invention can be applied to various layout patterns by, for example, forming gate electrodes for pairs of switching elements and gale electrodes for short circuit switching elements separately.

Switching elements other than MOS transistors can also be used for the pairs of switching elements.

According to the present invention, sources and drains of transistors constituting short circuit switching elements are formed so as to correspond to pairs of signal lines. Gates between the sources and drains between the signal lines then have a gate length in a widthwise direction of the signal lines. It is therefore possible to increase gate width without inviting increases in the distance between signal lines as the gate width of the transistors follows the direction of extension of the signal lines. The precharge operation can then be made high-speed without inviting increases in the distance between the signal lines because the short circuit effects due to the conduction of the short circuit switching elements is increased.

According to the present invention, a precharge operation can be made high-speed without inviting increases in the dimensions of the storage device due to increases in the distance between bit lines of a memory cell array and operating speed can therefore be increased without inviting increases in the size of the semiconductor storage device.

The present invention is described using various example situations but the present invention is by no means limited by the examples described. Various modifications of the examples described and other embodiments of the present invention can also be made clear by the manufacturer with reference to this description. All variations and embodiments lying within the scope of the claims are therefore to be included within the scope of the present invention.

What is claimed is:

1. A semiconductor device, comprising:

a power supply line which is provided with a pre-charging voltage;

a first signal line which is provided with a first data during an operation period;

a second signal line which is provided with a second data during the operation period; and a pre-charging circuit which sets voltages of the first signal line and the second signal line to the pre-charging voltage in response to a control signal during a precharging period before the operation period;

wherein the pre-charging circuit includes, (a) a first MOS transistor which connects the first signal line with the power supply line in response to the control signal during the pre-charging period, (b) a second MOS transistor which connects the second signal line with the power supply line in response to the control signal during the pre-charging period, (c) a third MOS transistor which connects the first signal line with the second signal line during the pre-charging period, wherein the third MOS transistor includes an elongate gate electrode that extends lengthwise between and parallel to the first signal line and the second signal line.

2. The semiconductor device according to claim 1, wherein the third MOS transistor further includes a source region and a drain region respectively located under the first and second signal lines.

3. The semiconductor device according to claim 2, wherein a channel length of the third MOS transistor extends between the source and drain regions and is perpendicular to the first and second signal lines.

4. The semiconductor device according to claim 3, wherein the first signal line and the second signal line are respectively connected with the source region and the drain region through a plurality of contact holes.

5. The semiconductor device according to claim 2, wherein the source region of the third MOS transistor also forms a source region or a drain region of the first MOS transistor, and wherein the drain region of the third MOS transistor also forms a source region or a drain region of the second MOS transistor.

6. The semiconductor device according to claim 5, wherein gate electrodes of the first and second MOS transistors are located in a same layer as and connected to the gate electrode of the third MOS transistor.

7. The semiconductor device according to claim 6, wherein the gate electrodes of the first, second and third MOS transistors together define a T-configuration in which the gate electrode of the third MOS transistor extends perpendicular to the gate electrodes of the first and second MOS transistors.

8. The semiconductor device according to claim 1, wherein gate electrodes of the first and second MOS transistors and the gate electrode of the third MOS transistor together define a T-configuration in which the gate electrode of the third MOS transistor extends perpendicular to the gate electrodes of the first and second MOS transistors.

9. A semiconductor device, comprising:
a power supply line which is provided with a pre-charging voltage;
a first pair of signal lines including a first signal line and a second signal which are respectively provided with a first data and a second data during an operation period;
a second pair of signal lines including a third signal line and a fourth signal line which are respectfully provided with a third data and a fourth data during the operation period; and
first and second pre-charging circuits which set voltages of the first pair signal lines and the second pair of signal lines to the pre-charging voltage in response to a control signal during a pre-charging period before the operation period;
wherein the first pre-charging circuit includes,
(a) a first MOS transistor which connects the first signal line with the power supply line in response to the control signal during the pre-charging period,
(b) a second MOS transistor which connects the second signal line with the power supply line in response to the control signal during the pre-charging period,
(c) a third MOS transistor which connects the first signal line with the second signal line during the pre-charging period, wherein the third MOS transistor includes an elongate gate electrode that extends lengthwise between and parallel to the first signal line and the second signal line;
wherein the second pre-charging circuit includes,
(a) a first MOS transistor which connects the third signal line with the power supply line in response to the control signal during the pre-charging period,
(b) a second MOS transistor which connects the fourth signal line with the power supply line in response to the control signal during the pre-charging period,
(c) a third MOS transistor which connects the third signal line with the fourth signal line during the pre-charging period, wherein the third MOS transistor includes an elongate gate electrode that extends lengthwise between and parallel to the third signal line and the fourth signal line.

10. The semiconductor device according to claim 9, further comprising a fourth MOS transistor which connects the second signal line with the third signal line during the pre-charging period, wherein the fourth MOS transistor includes an gate electrode that extends lengthwise between and parallel to the second signal line and the third signal line.

11. The semiconductor device according to claim 10, wherein the fourth MOS transistor further includes a source region and a drain region respectively located under the third and fourth signal lines, and wherein a channel length of the fourth MOS transistor extends between the source and drain regions and is perpendicular to the third and fourth signal lines.

12. The semiconductor device according to claim 11, wherein, in each of the first and second pre-charging circuits, the source region of the third MOS transistor also forms a source region or a drain region of the first MOS transistor, and the drain region of the third MOS transistor also forms a source region or a drain region of the second MOS transistor.

13. The semiconductor device according to claim 12, wherein, in each of the first and second pre-charging circuits, gate electrodes of the first and second MOS transistors are located in a same layer as and connected to the gate electrode of the third MOS transistor and the gate electrode of the fourth MOS transistor.

14. The semiconductor device according to claim 13, wherein the gate electrodes of the first, second and third MOS transistors of the first and second pre-charging circuits and the gate electrode of the third MOS transistor together define a comb-configuration in which the gate electrodes of the third MOS transistors and the gate electrode of the fourth MOS transistor extend perpendicular to the gate electrodes of the first and second MOS transistors.

15. The semiconductor device according to claim 10, wherein gate electrodes of the first, second and third MOS transistors of the first and second pre-charging circuits and the gate electrode of the fourth MOS transistor together define a comb-configuration in which the gate electrodes of the third MOS transistors and the gate electrode of the fourth MOS transistor extend perpendicular to the gate electrodes of the first and second MOS transistors.

16. A semiconductor device, comprising:
a power supply line which is provided with a pre-charging voltage;
a first pair of signal lines including a first signal line and a second signal which are respectively provided with a first data and a second data during an operation period;
a second pair of signal lines including a third signal line and a fourth signal line which are respectfully provided with a third data and a fourth data during the operation period;
first and second pre-charging circuits which set voltages of the first pair signal lines and the second pair of signal lines to the pre-charging voltage in response to a control signal during a pre-charging period before the operation period; and
an MOS transistor which connects the second signal line with the third signal line during the pre-charging period, wherein the MOS transistor includes an elongate gate electrode that extends lengthwise between and parallel to the second signal line and the third signal line.

17. The semiconductor device according to claim 16, wherein the MOS transistor further includes a source region and a drain region respectively located under the third and fourth signal lines, and wherein a channel length of the fourth MOS transistor extends between the source and drain regions and is perpendicular to the third and fourth signal lines.

18. The semiconductor device according to claim 17, wherein the MOS transistor is a first MOS transistor, and wherein the first and second pre-charging circuits respectively include second and third MOS transistors having gate electrodes which are contained in a same layer as and connected to the gate electrode of the first MOS transistor.

19. The semiconductor device according to claim 18, wherein the gate electrodes of the first, second and third MOS transistors together define a T-configuration in which the gate electrode of the first MOS transistor extends perpendicular to the gate electrodes of the second and third MOS transistors.

* * * * *